United States Patent [19]
Puetz et al.

[11] Patent Number: 5,315,252
[45] Date of Patent: May 24, 1994

[54] AUTOMOTIVE TEST SYSTEM WITH INPUT PROTECTION

[75] Inventors: Peter A. Puetz, Waukesha; John Hintz, New Berlin, both of Wis.

[73] Assignee: SPX Corporation, Muskegon, Mich.

[21] Appl. No.: 935,689

[22] Filed: Aug. 26, 1992

[51] Int. Cl.⁵ .................. F02P 17/00; G01R 27/08
[52] U.S. Cl. ............................ 324/402; 324/384; 324/503; 324/713; 364/431.01; 364/424.03; 73/118.1
[58] Field of Search ............... 324/380, 384, 402, 503, 324/537, 609, 691, 713, 110; 73/116, 118.1; 364/482, 483, 431.01, 431.02, 43.03, 424.03; 361/118; 330/291, 293, 298; 307/443, 475

[56] References Cited

U.S. PATENT DOCUMENTS

| | | | |
|---|---|---|---|
| 2,710,375 | 6/1955 | Mengali | 324/62 |
| 4,757,463 | 7/1988 | Ballou et al. | 364/551 |
| 5,177,447 | 1/1993 | Marino et al. | 324/713 |

OTHER PUBLICATIONS

Service Bulletin, "Vehicle System Test", Ford Granada '85-Scorpio: Section 290, Feb. 1985.
EDN Magazine, "Analog Switches & Multiplexers", Doug Conner, Mar. 15, 1990.
Machine Design Magazine, "How to Avoid ADC Errors in Microvolt Signals", Hauge et al., Sep. 7, 1989.
Evaluation Engineering Magazine, "Continuity/Bar--Board Testing", Paul O'Shea, May 1990.
EDN Magazine "Crosspoint Switch ICs Enter Digital Domain", Anne Watson Swager, Feb. 16, 1989.

*Primary Examiner*—Gerard R. Strecker
*Assistant Examiner*—Diep Do
*Attorney, Agent, or Firm*—Kinney & Lange

[57] ABSTRACT

An input protection circuit protects a multiplexer used in an automotive breakout box for coupling to an electronic control module (ECM) of an automotive vehicle. The input protection circuit includes resistors connected between the input and the multiplexer and a negative feedback amplifier connected to the output of the multiplexer. The negative feedback amplifier provides a virtual ground. Additionally, the inputs to the multiplexer are clamped to within one diode forward voltage drop of electrical ground by diode pairs.

17 Claims, 5 Drawing Sheets

AUTOMOTIVE TEST SYSTEM WITH INPUT PROTECTION

BACKGROUND OF THE INVENTION

The present invention relates to an automated automotive test system. In particular, the present invention provides input protection for an automated breakout box.

With the advent of integrated circuits, and with the increasing use of sophisticated electronic, electric and electromechanical sensors and control systems in automobiles, the testing and servicing of automobiles has presented ever-increasing challenges. At the present time, many tests of electrical systems, sensors and components of an automobile are made manually by a technician who unplugs a multipin connector between the vehicle's electronic control module (ECM) and the vehicle sensors and controls. The technician makes voltage and resistance measurements between various pins of the connector using a multimeter. The technician making those measurements is required to move the multimeter probe to the appropriate measurement points. It is also necessary to set the multimeter to the proper measuring formula, such as volts or ohms.

This manual testing procedure has many drawbacks. In particular, the technician must follow detailed instructions in order to perform the proper tests. The instructions require that the technician set the proper condition, select the proper test points, read the equipment properly, and compare the reading to the listed tolerances specified in the instructions.

Some test systems have been developed which simplify some of the test operations. These devices use selection switches to select the proper test points. While this helps to some extent, the technician is still required to use the instructions, set the multimeter, and compare readings to the listed tolerances for that measurement.

As the number of electrical systems and sensors increases, the number of possible combinations of points which need testing increases as well. An automated breakout box, therefore, would preferably make use of switching devices to make connections between the testing circuitry and the points to be tested. Analog multiplexers are available which are capable of selecting among a large number of different inputs or outputs.

Analog multiplexers have a maximum input which should not be exceeded. However, signals generated by internal combustion engines typically have a wide dynamic range that can exceed the maximum level which the multiplexer is able to switch. If this occurs, the multiplexer can be burned out.

SUMMARY OF THE INVENTION

The present invention provides input protection circuitry for a multiplexer of a breakout box in a test system for coupling to an electronic control module (ECM) of an automotive vehicle. The circuitry includes a high impedance element before the multiplexer and a negative feedback amplifier following the multiplexer. The negative feedback amplifier provides a virtual ground to an input selected by the multiplexer. The virtual ground and the high impedance element reduce the size of the input signal and thereby protect the multiplexer from damage. Input lines that are not selected are clamped near ground potential by two clamping diodes.

DETAILED DESCRIPTION OF THE PREFERRED EMBODIMENTS

Figure 1:
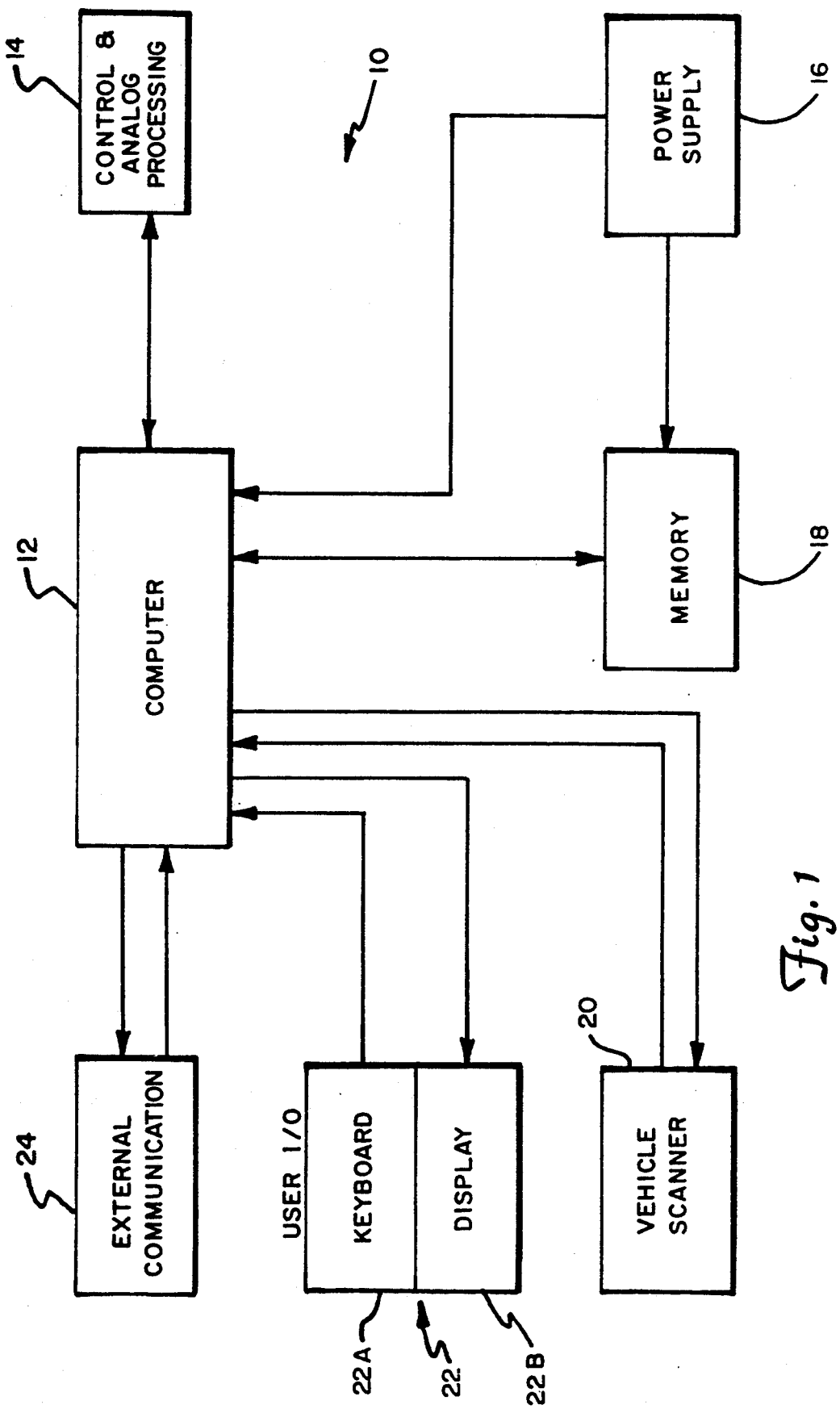
FIG. 1 is an electrical block diagram of an automated breakout box.

FIG. 1 shows automated breakout box 10 of the present invention, which includes digital computer 12, control and analog processing circuitry 14, power supply 16, memory 18, vehicle scanner 20, user input/output 22 (which includes keyboard 22A and display 22B), and external communication circuitry 24. Automated breakout box 10 is connected to an automobile through control and analog processing circuitry 14, and performs sequential testing of a variety of different systems and components, such as the electronic control module (ECM) and related vehicle sensors and controls, the fuel injection system, instrument panel displays and indicators, and the anti-lock braking system (ABS). Under the control of computer 12, automated breakout box 10 sets up the conditions for testing, does the test, records the test results, and supplies the test results to the operator/technician through the user display 22B to permit the results of the test to be reviewed.

Computer 12 is preferably a microprocessor-based computer system. Computer 12 provides control signals to control and analog processing circuitry 14 to set up circuitry 14 to make particular tests. In preferred embodiments of the present invention, circuitry 14 measures voltages, resistances, and pulse widths, and provides to computer 12 digital data which represents the measured values. As will be described in further detail with reference to FIGS. 2 and 3, control and analog processing circuitry 14 is capable of connection to the electrical system of an automobile, and can measure voltages and resistance between a large number of individual connector points.

Power supply 16 provides power to computer 12 and to memory 18.

Memory 18 preferably includes RAM, ROM, and EPROM storage for use by computer 12. The programs which operate computer 12 can be stored in memory 18. In addition, the specifications of the particular vehicle to be tested, including the particular pins to be accessed and the sequence of tests to be performed, is provided to computer 12 from memory 18. This allows the test to proceed automatically, without a need for the technician to read and follow a lengthy procedure in a printed manual. Because there are a large number of different vehicles, each with a unique set of connectors and test sequences, memory 18 preferably includes storage devices such as memory cards, memory cartridges, magnetic floppy disks, optical disks, or the like, which store all of the necessary information for a particular vehicle. Depending on the vehicle to be used, a selected storage device for that vehicle is inserted into memory 18, which includes an appropriate card reader, cartridge reader, disk drive or the like.

Vehicle scanner 20 is a device which can connect to a readout plug on a vehicle to obtain fault code information from the vehicle. For General Motors cars, the connector for fault code information is known as the ALDL connector. The fault code obtained by vehicle scanner 20 is supplied to computer 12, and is used to direct the testing to particular systems and components and to particular test sequences.

User I/O 22 preferably includes keyboard 22A and display 22B. The operator/technician provides information about the particular vehicle to be tested and the tests which are desired, and responds to prompts from computer 12 which are supplied to the display 22B.

As part of the automated testing procedure, information is supplied through display 22B to the operator/technician, indicating the test conditions which must be set. For example, in some tests the vehicle's ignition must be on, while in another test the ignition must be off. Similarly, some tests require that devices be moved (such as rotating the throttle plate to see if the resistance values are in the right range). Other tests require that the engine be running. Display 22B, under the control of computer 12, provides the necessary prompts and setup information to the operator/technician.

In addition, display 22B provides the operator/technician with the results of the test such as the test sequence number, the value read, the tolerance required by that particular test, and good or bad indication.

External communication circuitry 24 allows computer 12 to communicate with other computers and systems. In one preferred embodiment, external communication circuitry 24 includes CAN and RS232 communication capabilities.

Figure 2:
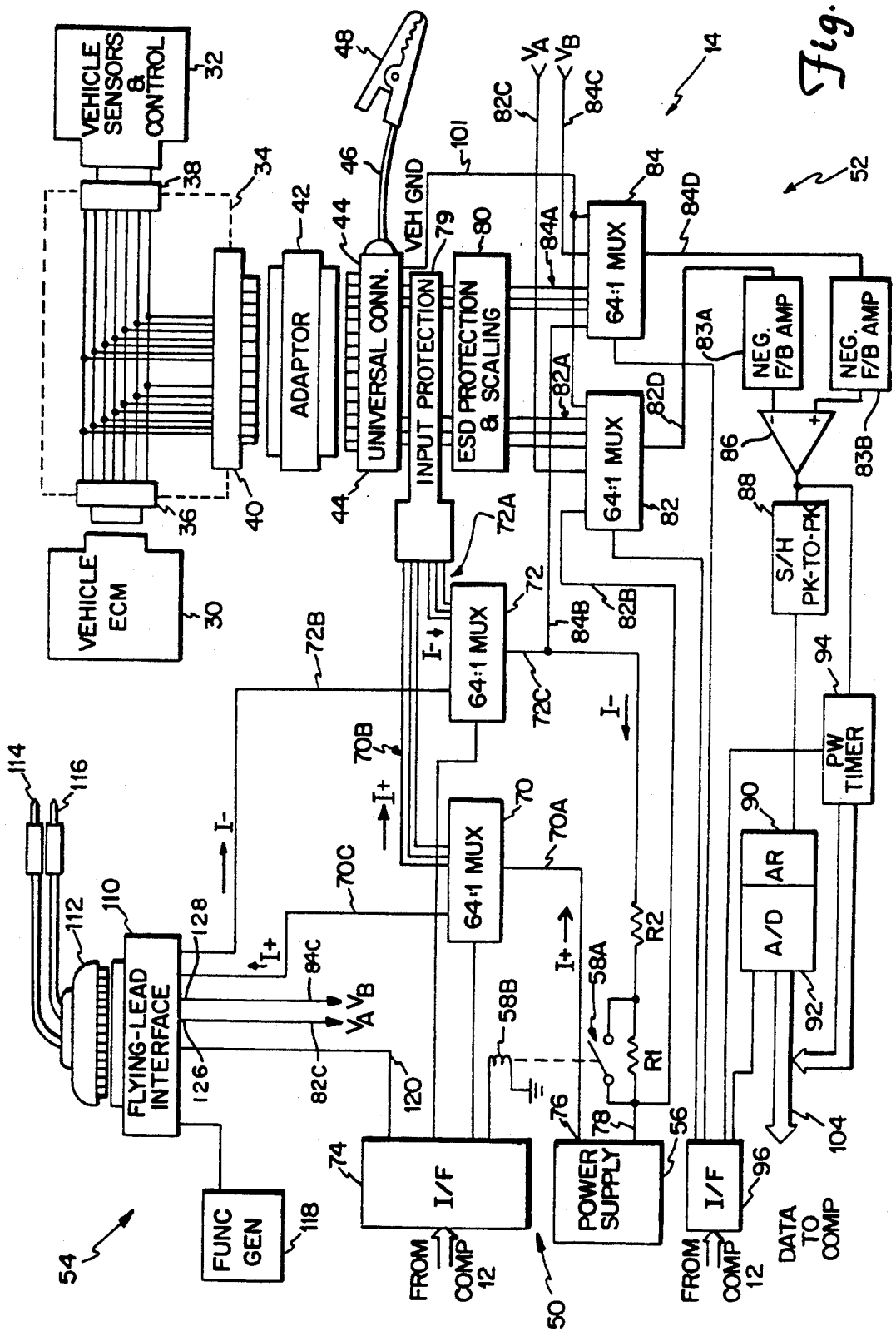
FIG. 2 is an electrical block diagram of the analog processing and control circuitry of the automated breakout box of FIG. 1.

FIG. 2 shows control and analog processing circuitry 14, which is used to make voltage and resistance measurements and to measure pulse width. In FIG. 2, vehicle ECM 30 and vehicle sensors and controls 32 are shown. Connection to ECM 30 and to vehicle sensors and controls 32 is made by breakout cable 34, which includes multipin connector 36 for connection to ECM 30, multipin connector 38 for connection to sensors and controls 32, and multipin connector 40 for connection to adaptor 42. The particular configuration of connector pins for vehicle ECM 30 and vehicle sensors and controls 32 will differ depending upon the manufacturer and in some cases the model of vehicle. Breakout cable 34 is one of several different cables available to the technician, and is arranged to mate with a particular manufacturer's ECM 30 and sensors and controls 32.

Adaptor 42 provides a connection between connector 40 of breakout cable 34 and universal multipin connector 44 of circuitry 14. The operator/technician has available a number of different breakout cables 34 and adapters 42 to allow circuitry 14 to be used with a variety of different manufacturers' vehicles.

Universal connector 44 mates with adaptor 42, and provides the connection between the test circuits of control and analog processing circuitry 14 and the electrical system or component which is being tested. In one preferred embodiment of the present invention, universal connector 44 is a 120-pin connector which has a separate ground wire 46 and allegator clamp 48 for connection to vehicle ground.

Connected to universal connector 44 is resistance measuring current supply circuit 50 and voltage measuring circuit 52. Control and analog processing circuitry 14 also includes flying lead circuitry 54, which allows measurement between any two points independent of universal connector 44.

Current supply circuitry 50 includes power supply 56, precision resistors R1 and R2, relay contact 58A and relay coil 58B, multiplexers 70 and 72 and interface 74. In a preferred embodiment of the present invention, a power supply 56 is a constant current power supply which operates at about 10 volts and supplies a 10 milliaamp constant current. Multiplexers 70 and 72 are 64:1 multiplexers.

The current I+ from terminal 76 of power supply 56 is supplied to input 70A of multiplexer 70. Based upon a control signal from interface 74, multiplexer 70 supplies current I+ to one of its outputs, which include sixty output lines 70B which are connected to connector 44 and output line 70C which is connected to flying lead circuitry 54. When cable 34 is being used, this causes current I+ to be steered to one of sixty different connection points through connector 44, adaptor 42, and cable 34. Return current I− from vehicle sensors and controls 32 is supplied through breakout cable 34 and connector 40 to adaptor 42 and then to universal connector 44. It is returned on one of sixty input lines 72A to multiplexer 72. Alternatively, return current is returned on input line 72B from flying lead circuit 54. Interface 74 supplies a signal to multiplexer 72 which selects one of the input lines 72A, 72B, and routes the return current I− through output line 72C to resistor R2. The return current I− flows through resistor R2 and through either resistor R1 or relay contacts 58A, depending on whether shunt relay coil 58B is energized or de-energized. The return current I− then flows to terminal 78 of power supply 56.

Interface 74 receives signals from computer 12 and selects the particular connector to which and from which current is supplied by the resistance measuring current loop. Interface 74 also selects the range of operation by selecting whether resistor R1 will be connected in series with resistor R2 or will be shunted by relay contacts 58A. In one preferred embodiment of the present invention, R1 is a 100K ohm resistor, while resistor R2 is a 200 ohm resistor.

In accordance with the present invention, input protection circuitry 79 is coupled to universal connector 44. This circuitry is explained below in more detail.

Voltage measuring circuit 52 includes electrostatic discharge (ESD) protection and scaling circuitry 80, multiplexers 82 and 84, negative feedback amplifier 83A, negative feedback amplifier 83B, operational amplifier 86, sample/hold and peak-to-peak detector circuit 88, auto-ranging circuitry 90, analog-to-digital (A/D) convertor 92, pulse width timer 94, and interface circuit 96.

Multiplexers 82 and 84 are 64:1 multiplexers which receive a plurality of input lines, and provide one output line each. Sixty input lines 82A to multiplexer 82 are supplied through ESD protection and scaling circuit 80. These sixty input lines 82A are connected to the same sixty pins of connector 44 as output lines 70B of multiplexer 70. In addition, multiplexer 82 receives input line 82B, which is connected to terminal 78 of power supply 56. The VA output of flying lead circuitry 54 (which will be described in further detail later) is also supplied on input, line 82C to multiplexer 82. Vehicle ground line 101 (which is connected to ground wire 46 and allegator clamp 48) is supplied as an input to multiplexer 82 and multiplexer 84.

Multiplexer 84 receives sixty input lines 84A from ESD protection and scaling circuit 80 which are connected to the same sixty pins of connector 44 as input lines 72A of multiplexer 72.

Multiplexer 84 also receives input line 84B which is connected to output line 72C of multiplexer 72. It also receives the VB output from flying lead circuitry 54 on input line 84C.

Multiplexers 82 and 84 are controlled by interface 96, which receives control signals from computer 12. Interface 96 also supplies control signals which determine whether A/D convertor 92 or pulse width timer 94 will be supplying data on lines 104.

Output lines 82D and 84D of multiplexers 82 and 84 are connected to the inverting (−) and non-inverting (+) inputs of operational amplifier 86, respectively. The output of operational amplifier 86 is supplied to both sample/hold and peak-to-peak detector circuit 88 and also to pulse width timer 94. The output of sample/hold and peak-to-peak detector circuit 88 is supplied to the auto-ranging circuitry 90 of A/D convertor 92. When A/D convertor 92 is selected by interface 96, it converts the analog voltage which receives at its input to a 12-bit digital value which is supplied on lines 104.

Pulse width timer 94, when selected by interface 96, receives the output of operational amplifier 86 and times the pulse width of the signal received. The measured pulse width is supplied as digital data on lines 104 to computer 12.

Flying lead circuitry 54 includes flying lead interface 110, connector 112, and a pair of probes 114 and 116. Function generator 118 is also connected to flying lead interface 110.

Interface 74 provides a general purpose control line 120 which selects operation through flying lead circuit 54, rather than through breakout cable 34, adaptor 42, and universal connector 44. When selected, flying leads probes 114 and 116 are used to contact selected leads or pins. Various voltage and resistance measurements can be made which are similar to the measurements made through cable 34. Resistance measurements current is provided to and from flying lead interface 110 through lines 70C and 72B which are connected to multiplexers 70 and 72, together with voltage outputs 126 and 128 which supply the VA and VB output voltages to multiplexers 82 and 84.

Voltage measurements are made by circuit 14 through the use of voltage measuring circuitry 52. Computer 12 selects, through interface 96, the two connector points of universal connector 44 which are to be connected to A/D convertor 92. This selection is done through multiplexers 82 and 84. The output voltages from multiplexers 82 and 84 are supplied on lines 82D and 84D to operational amplifier 86, and through sample/hold and peak-to-peak detector circuitry 88 and auto-ranging circuitry 90 to the input of A/D convertor 92.

If additional voltages are to be measured, computer 12 changes the control signals supplied to interface 96, which causes multiplexers 82 and 84 to select other pins for connection to operational amplifier 86.

The same voltage measurements can be made through flying lead circuit 54. Interface 74 provides a control signal on line 120 to flying lead interface 110. The VA and VB voltages are supplied on input lines 82C and 84C of multiplexers 82 and 84, and are connected to output lines 82D and 84D and thus to the inputs of operational amplifier 86.

When resistance measurements are to be made, both current supply circuit 50 and voltage measuring circuit 52 are active. Normally, breakout cable 34 will be connected only to vehicle sensors and controls 32 during a resistance measurement test. This avoids having a component within the vehicle ECM affecting the resistance measurement. During a voltage measurement, on the other hand, both ECM 30 and vehicle sensors and controls 32 are normally connected to breakout cable 34.

Power supply 56, which is preferably a constant current source providing current at a level of about 10 milliamps and nominally about 10 volts, supplies current I+ through multiplexer 70 to one of the sixty lines 70B to connector 44. The return current I− is supplied from connector 44 to one of the sixty input lines 72A of multiplexer 72, and then from output line 72C through one or both the resistors R1 and R2. Computer 12 selects, through interface 74 and shunt relay coil 58B, whether resistor R1 will be shunted by contacts 58A.

When the resistance measuring mode is first selected, multiplexers 82 and 84 are controlled to connect the selected two pins of connector 44 to the inputs of operational amplifier 86. At this time, current is not yet being supplied through multiplexers 70 and 72, and therefore no voltage should appear between the + and − inputs of operational amplifier 86. If a voltage does appear, the data on lines 104 to computer 12 will indicate the presence of the non-zero voltage, and computer 12 will stop and provide a message through display 22B. Computer 12 will not allow a resistance measurement to continue until the operator/technician supplies an input through keyboard 22A indicating that the condition has been corrected. Typically, this situation will occur because ECM 30 has not been disconnected from breakout cable 34.

If no voltage appeared on the selected pins, computer 12 will instruct multiplexers 70 and 72 to select the same two pins which are selected by multiplexers 82 and 84. Circuitry 14 is then ready to perform the resistance check.

Multiplexers 82 and 84 are instructed to set measuring points to lines 82B and 84B. The voltage reading between these two lines represents the voltage across resistors R1 and R2. Since the resistance between lines 82B and 84B is known (i.e., either R1+R2 or just R2), the voltage reading which is obtained provides an indication of the current which is flowing through the current loop.

Computer 12 then instructs multiplexers 82 and 84 to read the voltage across the pre-selected pins. Since the current was known by the previous measurement, computer 12 is able to derive the resistance by measuring the voltage between the two pins and dividing that voltage by the current which had just been read.

This method allows the reading of very small resistances very accurately. The internal resistances of multiplexers 70, 72, 82 and 84 do not affect the accuracy of the measurement. As a result, the present invention allows the use of solid state multiplexers which are substantially lower cost, more reliable, and more compact than relays.

Figure 3:
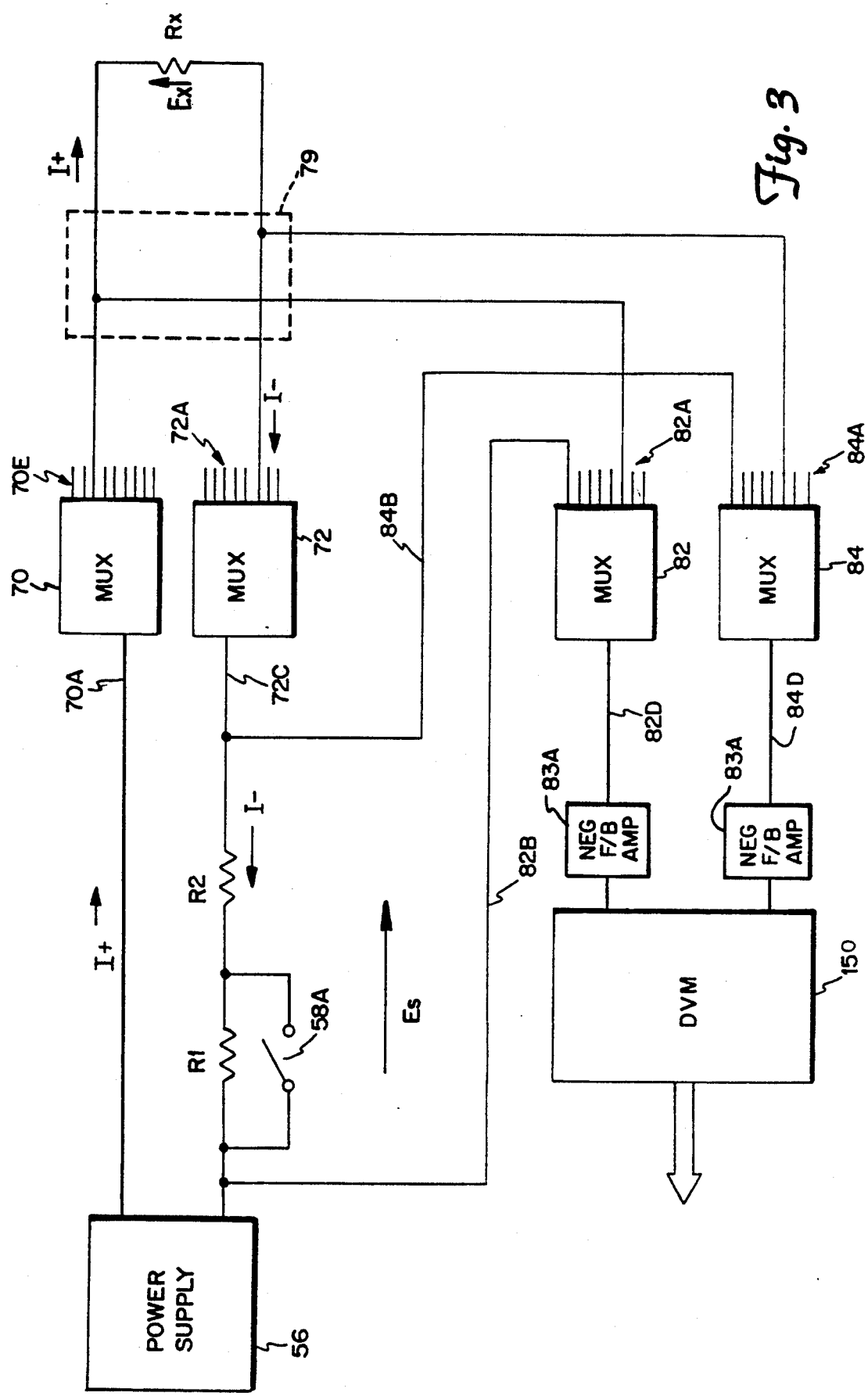
FIG. 3 is a simplified block diagram illustrating the resistance measurement circuitry of the present invention.

FIG. 3 shows a simplified version of the resistance measurement circuitry shown in FIG. 2. In FIG. 3, digital voltmeter 150 represents the circuitry formed by operational amplifier 86, sample/hold and peak-to-peak detector circuitry 88, auto-ranging circuitry 90, and A/D convertor 92. In addition, the diagram is simplified by not showing breakout cable 34, adaptor 42, universal connector 44 and flying lead circuitry 54. The resistance to be measured is referred to as $R_x$, the voltage across resistors R1 and R2 is $E_s$, and the voltage across resistor $R_x$ is $E_x$.

During the first measurement, the voltage $E_s$ is read by digital voltmeter 150 through multiplexers 82 and 84. The current $I_x$ is:

$$I_x = \frac{E_s}{R1 + R2} \qquad \text{Eq. 1}$$

In the next step of the process, digital voltmeter 150 reads voltage $E_x$. Since $I_x$ is already known and $E_x$ is measured, resistance $R_x$ can be determined by:

$$R_x = \frac{E_x}{I_x} \qquad \text{Eq. 2}$$

The internal resistances of multiplexers 70 and 72 are not involved in these readings. $E_s$ is measured directly across resistors R1 and R2, and $E_x$ is measured directly across $R_x$. Multiplexers 70 and 72 simply steer the current $I_x$ to and from resistor $R_x$, but are not involved in the voltage measurements from which resistance $R_x$ is derived.

The internal resistances of multiplexers 82 and 84 also do not affect the voltage readings because those resistances (approximately 75 ohms) are very small compared to the high input impedance (typically 10 megohms) of digital voltmeter 150.

Figure 4:
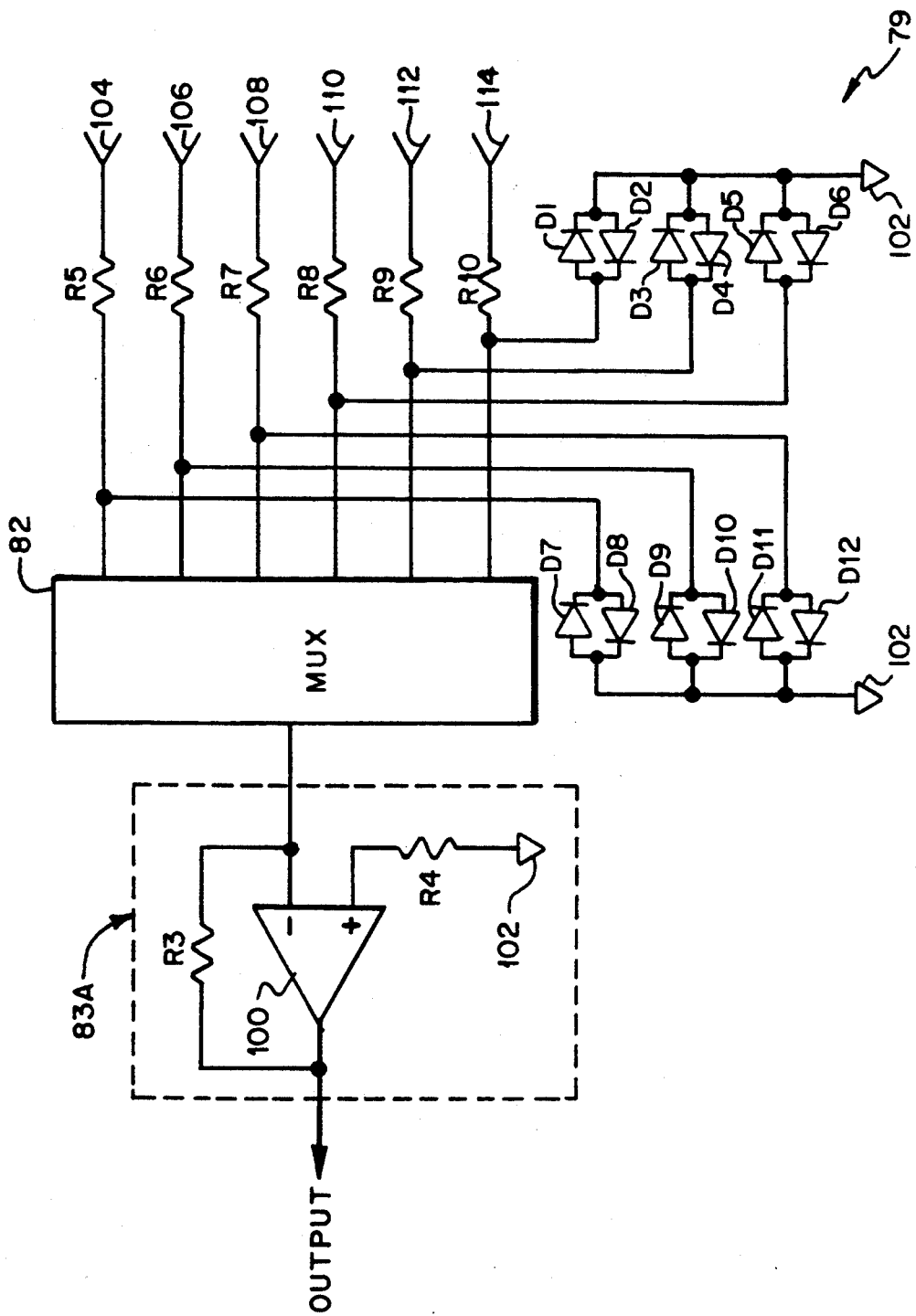
FIG. 4 is a simplified schematic diagram of input protection circuitry in accordance with the present invention.

FIG. 4 is a simplified schematic diagram of input protection circuitry in accordance with the present invention. For simplicity, only a single multiplexer (multiplexer 82) is shown. However, the schematic diagram of FIG. 4 also applies to multiplexer 84. Negative feedback amplifier 83A includes OPAMP 100 and resistors R3 and R4. Resistor R3 is connected between the output of OPAMP 100 and its inverting input. Resistor R4 is connected between the non-inverting input of OPAMP 100 and electrical ground 102. The inverting input of OPAMP 100 is also connected to the output of multiplexer 82. For simplicity, multiplexer 82 is shown with only 6 inputs.

Multiplexer 82 is coupled to input 104, 106, 108, 110, 112, and 114 through input protection circuitry 79. Input protection circuitry 79 includes resistors R5, R6, R7, R8, R9, and R10. Resistor R5 is connected to input 104, resistor R6 is connected to input 106, resistor R7 is connected input 108, resistor R8 is connected to input 110, resistor R9 is connected to input 112, and resistor R10 is connected to input 114. Input protection circuitry 79 includes clamping diodes which are connected between electrical ground 102 and the inputs to multiplexer 82. Input protection circuitry 79 includes diode pairs D1 and D2, D3 and D4, D5 and D6, D7 and D8, D9 and D10, and D11 and D12.

The inputs to multiplexer 82 must be kept within a limited range to prevent damage to the device. Normally, the inputs to multiplexer 82 would be adjusted such that normal operating levels do not exceed the maximum input level. However, excessive voltages may be present at inputs to multiplexer 82 due to spikes in the measured signal or other spurious inputs. Input protection circuitry 79 and negative feedback amplifier 83A operate to prevent damage to multiplexer 82 from excessive input voltages.

The circuitry of FIG. 4 is designed to overcome two problems which may arise in an automated breakout box. First, signals from the ECM may have amplitudes which exceed several hundred volts. This voltage level is greater than the aximum input level of the analog multiplexers and can cause damage to the electronics or disrupt operation of the breakout box. Second, the multiplexers introduce a capacitance that can limit bandwidth of the test system.

Figure 5:
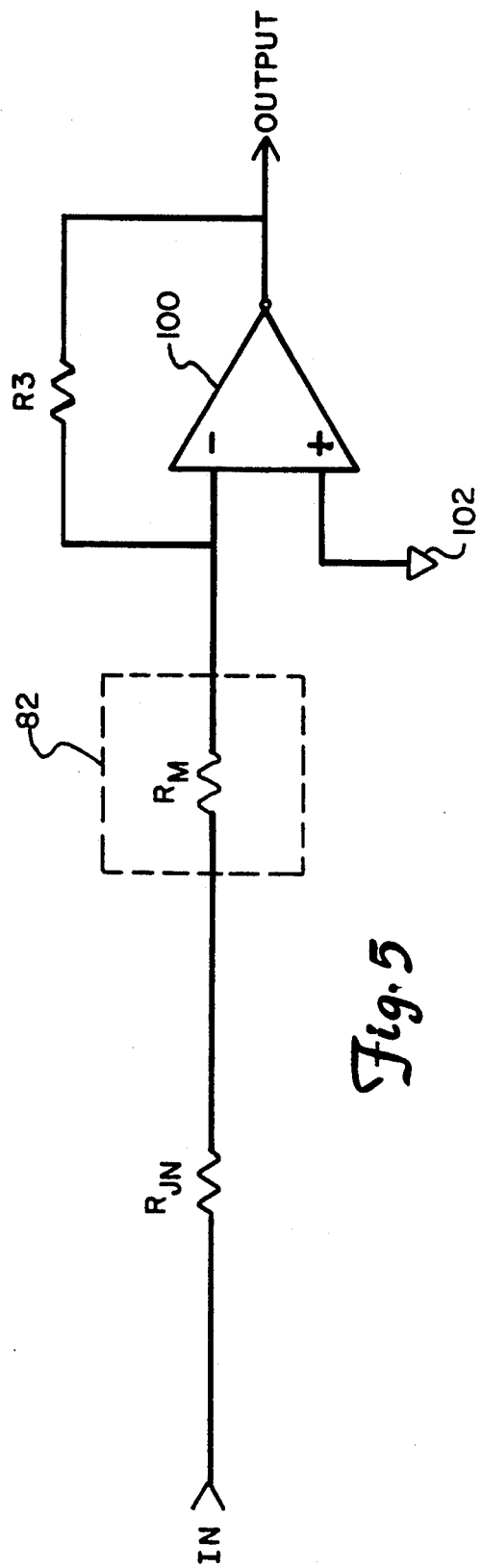
FIG. 5 is a simplified schematic diagram of a selected input.

The multiplexer overvoltage problem is solved with two mechanisms. The input line selected by multiplexer 82 is connected to negative feedback amplifier 83A which provide a virtual ground point at the output of multiplexer 82. FIG. 5 is a simplified schematic diagram for an input line selected by multiplexer 82. Multiplexer 82 is represented by a small resistance $R_M$. Typically $R_M$ is less than a few hundreds Ohms. In comparison, $R_{IN}$ (i.e., R5, R6, R7, R8, R9, or R10 shown in FIG. 4) may be 5 MOhm. The virtual ground provided by OPAMP 100 in combination with the relatively small resistance of $R_M$ and the relatively large resistance of $R_{IN}$ cause most of the input voltage to be dropped across the resistance $R_{IN}$. Thus, the voltage level at the input to multiplexer 82 is quite small.

As to the input channels which have not been selected by multiplexer 82, diode pairs D1 and D2, D3 and D4, D5 and D6, D7 and D8, D9 and D10, and D11 and D12 clamp the voltage at the inputs of multiplexer 82 to plus and minus one diode forward voltage drop (about 0.6 to about 0.7 volts) of ground potential. Additionally, the diodes pairs do not limit input sensitivity. Input resistors R5, R6, R7, R8, R9, and R10 are selected so that they do not significantly alter circuit operation.

The capacitance problem arises because of the capacitance between each non-selected input line and the inverting amplifier. Multiplexer 82 in FIG. 4 represents only one of many such multiplexer integrated circuits in the multiplexer bank 82 of FIGS. 2 and 3. Each 8-input multiplexer of multiplexer bank 82 has its output pin connected to the inverting input pin of OPAMP 100. Each of these multiplexers adds an incremental capacitance at the inverting input pin of OPAMP 100 that reacts with the other components of the input protection circuitry. This capacitance normally would be overcome by the current flowing from the ECM system. However, since this current must flow through a large input resistance, the RC time constant may be too long to achieve the required bandwidth. Inverting amplifier 83A reduces the effect of the capacitance through the use of a feedback resistor which reduces the RC time constant. Since the feedback resistor in the negative feedback amplifier is much smaller than the input resistance, the time required to charge the output capacitance of the multiplexer is substantially reduced. This increases the bandwidth of the system.

Although the present invention has been described with reference to preferred embodiments, workers skilled in the art will recognize that changes may be made in form and detail without departing from the spirit and scope of the invention.

What is claimed is:

1. A test system capable of coupling to an electronic control module (ECM) of an automotive vehicle for testing various electrical components of the automotive vehicle, wherein the ECM is electrically connected to the electrical components of the automotive vehicle, the test system comprising:

connector means having a plurality of pins for coupling the test system to the ECM;

a multiplexer coupled to the connector means for selecting one of the pins of the connector means and including a multiplexer output;

high impedance means electrically connected between the ECM and the multiplexer;

a negative feedback amplifier coupled to the multiplexer output, the negative feedback amplifier providing a virtual ground at the muliplexer output; and sensor means coupled to the negative feedback amplifier for sensing an electrical characteristic of an electrical component of the automotive vehicle.

2. The test system of claim 1 and clamping means for clamping a voltage at an input of the multiplexer within a predetermined range.

3. The test system of claim 2 wherein the clamping means comprises a plurality of diodes.

4. The test system of claim 1 wherein the negative feedback amplifier comprises an operational amplifier.

5. The test system of claim 1 wherein the multiplexer includes a plurality of inputs, each of which is electrically connected to one of the pins of the connector means, and wherein the high impedance means comprises a plurality of high impedance elements each of which is coupled to an input of the multiplexer.

6. The test system of claim 1 wherein the high impedance element comprises a resistor.

7. A test system capable of coupling to an electronic control module (ECM) of an automotive vehicle for testing various electrical components of the automotive vehicle, wherein the ECM is electrically connected to the electrical components of the automotive vehicle, the test system comprising:

connector means having a plurality of pins for coupling the test system to the ECM;

a plurality of high impedance elements, each of which is coupled to one of the pins of the connector means;

a multiplexer having an output and having a plurality of inputs each of which is coupled to one of the high impedance elements;

virtual ground means coupled to the output of the multiplexer for providing a virtual electrical ground at the multiplexer output; and test means coupled to the virtual ground means for testing a selected electrical component of the automotive vehicle.

8. The test system of claim 7 wherein the virtual ground means comprises a negative feedback amplifier.

9. The test system of claim 7 and a plurality of voltage clamping means each of which is coupled to one of the inputs of the multiplexer for clamping a voltage on the input within a predetermined range.

10. The test system of claim 9 wherein each voltage clamping means comprises a plurality of diodes.

11. The test system of claim 7 wherein each high impedance element comprises a resistor.

12. A test system for testing electrical components of an automotive vehicle, the test system capable of being electrically connected to an electronic control module of an automotive vehicle which is electrically connected to the electrical components of the vehicle, the test system comprising:

sensor means for measuring the electrical characteristics of an electrical component coupled to an input of the sensor means;

multiplexer means having an input for electrical connection to the electronic control module and having an output which is electrically connected to the input of the sensor means, the multiplexer means being capable of coupling a selected electrical component of the automotive vehicle to the input of the sensor means; and protection means, electrically connected to the multiplexer means, for limiting the voltage applied to the input of the multiplexer means, the protection means comprising a high impedance means for connection between the electronic control module and the input of the multiplexer means, and an amplifier means for electrical connection to the multiplexer means, the amplifier means providing a virtual ground at the multiplexer means output.

13. The test system of claim 12 wherein the amplifier means comprises an operational amplifier having an output electrically connected to the sensor means, an inverting input electrically connected to the multiplexer means output and a non-inverting input electrically connected to electrical ground.

14. The test system of claim 13 wherein the operational amplifier comprises a voltageshunt feedback amplifier.

15. The test system of claim 12 wherein the protection means further comprises clamping means for holding the voltage at the input of the multiplexer means within a selected range.

16. The test system of claim 15 wherein the clamping means comprises a plurality of diodes.

17. The test system of claim 12 wherein the high impedance means comprises a plurality of resistors.

* * * * *

UNITED STATES PATENT AND TRADEMARK OFFICE
CERTIFICATE OF CORRECTION

PATENT NO. : 5,315,252

DATED : May 24, 1994

INVENTOR(S) : PETER A. PUETZ, JOHN HINTZ

It is certified that error appears in the above-identified patent and that said Letters Patent is hereby corrected as shown below:

Col. 4, lines 9-10, delete "millaamp", insert --milliamp--

Col. 4, line 65, delete "input,", insert --input--

Col. 8, line 3, delete "aximum", insert --maximum--

Col. 9, line 8, delete "muliplexer", insert --multiplexer--

Col. 10, line 41, delete "voltageshunt", insert --voltage-shunt--

Signed and Sealed this

Twentieth Day of September, 1994

Attest:

BRUCE LEHMAN

Attesting Officer

Commissioner of Patents and Trademarks